METHOD OF FORMING A SUPERCONDUCTIVE BODY

Filed Feb. 5, 1965

Inventors:
Paul S. Swartz ;
Carl H. Rosner ;
Harold H. Hirsch ,
by Paul R. Webb, II
Their Attorney.

3,196,532

METHOD OF FORMING A SUPERCONDUCTIVE BODY

Paul S. Swartz, Carl H. Rosner, and Harold H. Hirsch, all of Schenectady, N.Y., assignors to General Electric Company, a corporation of New York Filed Feb. 5, 1965, Ser. No. 430,773
10 Claims. (Cl. 29—420)

This application is a continuation-in-part of our copending application filed November 2, 1961, as Serial Number 149,594, now abandoned, and a continuation-in-part of our copending application filed March 2, 1962, as Serial Number 180,390, now abandoned, and both assigned to the same assignee as the present application.

This invention relates to methods of forming a superconductive body in bulk form and more particularly to methods of forming a high critical field superconductive body in bulk form in which the body has a reaction product therein containing a continuous network of superconducting material.

While the existence of superconductivity in many metals, metal alloys and metal compounds has been known for many years, the phenomenon has been more or less treated as a scientific curiosity until comparatively recent times. The awakened interest in superconductivity may be attributed, at least in part, to technological advances in the arts where their properties would be extremely advantageous in magnets, generators, direct current motors and low frequency transformers, and to advances in cryogenics which removed many of the economic and scientific problems involved in extremely low temperature operations.

As is well known, superconduction is a term describing the type of electrical current conduction existing in certain materials cooled below a critical temperature, $T_c$, where resistance to the flow of current is essentially non-existent. A high critical field superconductive body is a body with a superconductive phase therein in which the superconductive phase retains its superconductive properties in magnetic fields greater than the thermodynamic critical field of the superconductive phase.

It would be desirable to provide methods of forming a high critical field superconductive body in bulk form in which the body has a reaction product therein containing a continuous network of superconducting material. Bulk bodies include various configurations.

It is an object of our invention to provide a method of forming a high critical field superconductive body in bulk form.

It is a further object of our invention to provide a method of forming a high critical field superconductive body in bulk form in which the body has a reaction product therein containing a continuous network of superconducting material.

In carrying out our invention in one form, a method of forming a high critical field superconductive body in bulk form comprises compacting metal powder, reacting the compacted powder with a molten second metal, and forming a body with a reaction product therein containing a continuous network of a superconducting material.

These and various other objects, features and advantages of the invention will be better understood from the following description taken in connection with the accompanying drawing in which.

Figures 1, 2, 3:
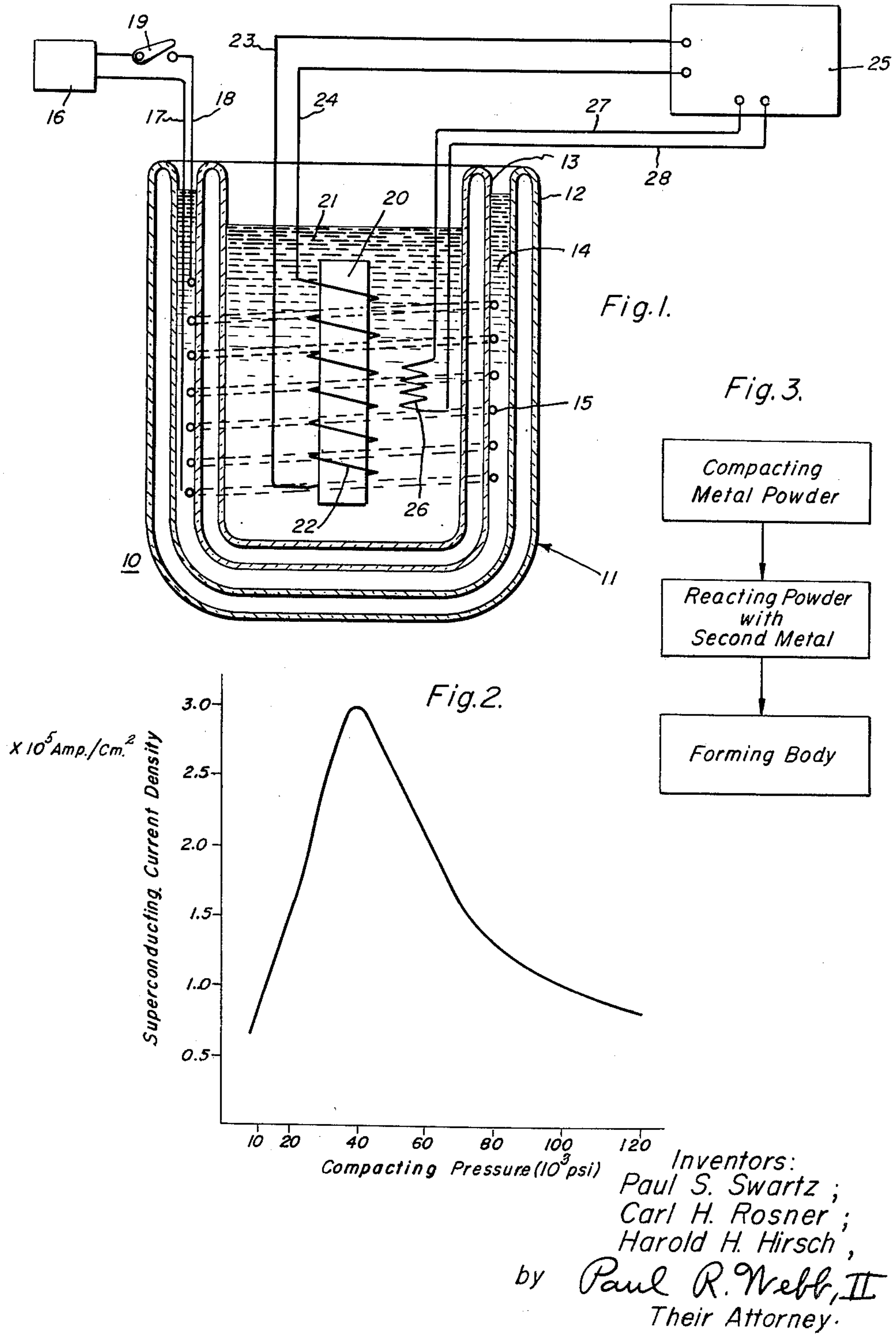
FIGURE 1 is a sectional view of apparatus employed to measure flux penetration into a high critical field superconductive body in bulk form.
FIGURE 2 is a graph showing compacting pressure of columbium powder in a high critical field superconductive body in bulk form of columbium and tin versus superconducting current density.
FIGURE 3 is a schematic diagram showing the steps of applicants' method.

We discovered that high critical field superconductive bodies in bulk form could be formed by compacting metal powder, reacting the compacted metal powder with a second metal in liquid or gaseous state, and forming a body with a reaction product therein containing a continuous network of a superconducting material. The reaction product comprises from a few percent to one hundred percent of the volume of the superconductive body. For example, columbium, molybdenum and vanadium can be employed for the metal powder while tin, aluminum, rhenium and silicon can be employed as the second metal. These metals can form high critical field superconductive bodies in bulk form in which the body is of columbium and tin, columbium and aluminum, molybdenum and rhenium, and vanadium and silicon. Pressures of 10,000 pounds per square inch to 120,000 pounds per square inch are satisfactory for compacting the metal powder. The compacted metal powder can be infiltrated with the second metal by contacting the powder with the molten second metal or by exposing the compacted powder to vapors from the second metal. For example, the compacted metal powder can be positioned in molten metal within a non-reactive container. An argon or other inert atmosphere is confined above the molten metal. Hydrogen or a vacuum might also be employed. If desired, pressure can be applied to the molten metal to improve the infiltration. If a vapor is employed, the second metal is heated to produce a vapor to which the compacted powder, positioned within an evacuated enclosure, is subjected. Temperatures and time periods are chosen for infiltration of the compacted powder with the second metal to produce a body with a reaction product therein containing a continuous network of a superconducting material.

In FIGURE 1 of the drawing, apparatus is shown generally at 10 for measuring flux penetration of a bulk, high critical field superconductive body at a temperature of 4.2° K. Apparatus 10 comprises an insulated container 11 having an outer insulated vessel 12 and an inner insulated vessel 13 separated by liquid nitrogen 14. A solenoid 15 is positioned within liquid nitrogen 14 in vessel 12 and is connected to a power source 16 by means of leads 17 and 18. A switch 19 is provided in lead 18 between solenoid 19 and power source 16 to energize and de-energize solenoid 15 to create a magnetic field. A bulk, high critical field superconductive body 20 in the form of a rod is positioned within liquid helium 21 in vessel 13 and within the magnetic field created by solenoid 15. A coil 22 is positioned around body 20 and connected by leads 23 and 24 to a D.C. hysteresigraph 25. A search coil 26 is positioned adjacent body 20 and connected by leads 27 and 28 to D.C. hysteresigraph 25. Coil 22 measures the amount of magnetic flux penetration into body 20 versus the applied magnetic field from solenoid 15. Search coil 26 measures the magnitude of the magnetic field from solenoid 15.

In the operation of apparatus 10 in FIGURE 1, body 20 is positioned within coil 22 in vessel 13. Liquid helium is poured into vessel 13 to immerse body 20 and cools body 20 to liquid helium temperature, 4.2° K. Switch 19 is closed to energize solenoid 15 to create a magnetic field within body 20 which magnetic field is increased from zero to some magnetic field, $H_a$, and reduced again to zero. Upon increasing the field gradually, magnetic flux penetration is recorded on the Y-axis of hysteresigraph 25. Upon subsequent reduction of the magnetic field to zero, only part of the penetrated magnetic flux, usually one half, comes out again, because of the filamentary network behavior. The magnetic field is then increased to $-H_a$ and back again to zero. The vertical axes of the hysteresis loops displayed on hysteresigraph 25 are calibrated in terms of a magnetic flux density, $H_p$, averaged over the entire cross-section of body 20. Maximum vertical deflection occurs when no magnetic flux is excluded from body 20 and the magnetic flux density within body 20 is the same as the applied magnetic flux density.

Hence, the total magnetic flux, $\Phi_p$, penetrating into the walls of body 20 is $\Phi_p = H_p \pi R^2$ where R is the radius of body 20. The depth, D, to which this magnetic flux penetrates is given by:

$$D = \frac{2\Phi_p}{H_a(2\pi R)} = \frac{H_p R}{H_a}$$

If a magnetic field, $H_a$, is applied to a high critical field superconductive body in a superconducting state, the magnetic field will penetrate into the surface of the body to a depth given by:

$$D = \frac{10 H_a}{4\pi J}$$

where J is the critical superconducting current density assumed to be independent of the magnitude of the applied field, $H_a$. From the above equation, the average superconducting current density, $\bar{J}$, between zero and H, is calculated as:

$$\bar{J} = \frac{10 H_a^2}{4\pi R H_p}$$

In FIGURE 2, a graph shows compacting pressure of columbium powder versus superconducting current density in units of $10^5$ amperes per square centimeter. The points for this graph were obtained in the following manner.

Five high critical field superconductive bodies in bulk form were prepared by compacting columbium powder within a pressure range of 10,000 pounds per square inch to 120,000 pounds per square inch. Specifically, the compacting pressures were 10,000; 20,000; 40,000; 80,000; and 120,000 pounds per square inch. The columbium powders were reacted with tin in the molten state for two hours at 1000° C. and cooled slowly to form bodies in the form of rods. Each rod was machined to a diameter of 0.500 inch and a length of 0.750 inch.

Each of these rods was positioned within a coil 22 in liquid helium 21 in the apparatus shown generally in FIGURE 1 of the drawing. The apparatus was operated as described above and the average superconducting current density, J, betwen zero and $H_a$ was calculated for each of these rods. These current densities, which are plotted on the graph in FIGURE 2, were calculated as 0.8, 1.5, 3.0, 1.3 and $0.8 \times 10^5$ amperes per square centimeter for the respective rods. Each body has a reaction product therein containing a continuous network of a superconducting material.

In FIGURE 3, a schematic diagram of applicants' method is set forth disclosing the steps of compacting metal powder, reacting the compacted powder with a molten second metal or with the vapors of a second metal, and forming a body with reaction product therein containing a continuous network of a superconducting material.

We found that a high critical field superconductive body in bulk form in which the columbium powder was compacted at 40,000 pounds per square inch and immersed in molten tin exhibits a superconducting current density of $3.0 \times 10^5$ amperes per square centimeter in fields up to 7000 oersteds. We found further that a high critical field superconductive body in bulk form in which the columbium powder was compacted in a pressure range of 30,000 pounds per square inch to 56,000 pounds per square inch and immersed in molten tin exhibits a superconducting current density of at least $2.5 \times 10^5$ amperes per square centimeter in fields up to 7000 oersteds. A high critical field superconductive body in bulk form in which the columbium powder was compacted in a pressure range of 24,000 pounds per square inch to 66,000 pounds per square inch and immersed in molten tin exhibits a superconducting current density of at least $2.0 \times 10^5$ amperes per square centimeter in fields up to 7000 oersteds.

While other modifications of this invention and variations thereof which may be employed within the scope of the invention have not been described, the invention is intended to include such that may be embraced within the following claims.

What we claim as new and desire to secure by Letters Patent of the United States is:

1. A method of forming a high critical field superconductive body in bulk form which comprises compacting vanadium powder, reacting said compacted vanadium powder with molten silicon, and forming a body with a reaction product therein containing a continuous network of a superconducting material.

2. A method of forming a high critical field superconductive body in bulk form which comprises compacting molybdenum powder, reacting said compacted molybdenum powder with molten rhenium, and forming a body with a reaction product therein containing a continuous network of a superconducting material.

3. A method of forming a high critical field superconductive body in bulk form which comprises compacting columbium powder, reacting said compacted columbium powder with molten aluminum metal, and forming a body with a reaction product therein containing a continuous network of a superconducting material.

4. A method of forming a high critical field superconductive body in bulk form which comprises compacting columbium powder, reacting said compacted columbium powder with molten tin, and forming a body with a reaction product therein containing a continuous network of a superconducting material.

5. A method of forming a high critical field superconductive body in bulk form which comprises compacting columbium powder, reacting said compacted columbium powder with the vapors of tin, and forming a body with a reaction product containing a continuous network of a superconducting material.

6. A method of forming a high critical field superconductive body in bulk form which comprises compacting columbium powder in a pressure range of 10,000 pounds per square inch to 120,000 pounds per square inch, reacting said compacted columbium powder with molten tin, and forming a body with a reaction product therein containing a continuous network of a superconducting material.

7. A method of forming a high critical field superconductive body in bulk form which comprises compacting columbium powder in a pressure range of 24,000 pounds per square inch to 66,000 pounds per square inch, reacting said compacted columbium powder with molten tin, and forming a body with a reaction product therein containing a continuous network of a superconducting material.

8. A method of forming a high critical field superconducting body in bulk form which comprises compacting columbium powder in a pressure range of 30,000 pounds per square inch to 56,000 pounds per square inch, reacting said compacted columbium powder with molten tin, and forming a body with a reaction product therein containing a continuous network of a superconducting material.

9. A method of forming a high critical field superconductive body in bulk form which comprises compacting columbium powder at a pressure of 40,000 pounds per square inch, reacting said compacted columbium powder with molten tin, and forming a body with a reaction product therein with a continuous network of a superconducting material.

10. A method of forming a high critical field superconductive body in bulk form which comprises compacting columbium powder at a pressure of 40,000 pounds per square inch, reacting said compacted columbium powder with molten tin at a temperature of 1000° C. for two hours, and forming a body with a reaction product therein with a continuous network of a superconducting material.

References Cited by the Examiner

UNITED STATES PATENTS

| | | | |
|---|---|---|---|
| 2,581,252 | 1/52 | Goetzel et al. | 29—420 |
| 2,612,442 | 9/52 | Goetzel | 29—182.1 |
| 2,671,955 | 3/54 | Grubel et al. | 75—208 |
| 2,714,556 | 8/55 | Goetzel | 29—182.1 |
| 3,069,757 | 12/62 | Beggs et al. | 29—182.1 |

WHITMORE A. WILTZ, *Primary Examiner.*